United States Patent
Saito et al.

(10) Patent No.: US 9,076,952 B2
(45) Date of Patent: Jul. 7, 2015

(54) SEMICONDUCTOR LIGHT-EMITTING DEVICE

(71) Applicant: Stanley Electric Co., Ltd., Tokyo (JP)

(72) Inventors: Takao Saito, Tokyo (JP); Takahiko Nozaki, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 14/154,821

(22) Filed: Jan. 14, 2014

(65) Prior Publication Data
US 2014/0197445 A1 Jul. 17, 2014

(30) Foreign Application Priority Data

Jan. 16, 2013 (JP) .................................. 2013-005129

(51) Int. Cl.
*H01L 33/00* (2010.01)
*H01L 33/64* (2010.01)
*H01L 33/48* (2010.01)

(52) U.S. Cl.
CPC ............. *H01L 33/642* (2013.01); *H01L 33/483* (2013.01); *H01L 33/486* (2013.01); *H01L 2224/48091* (2013.01)

(58) Field of Classification Search
CPC ..... H01L 33/64; H01L 33/642; H01L 33/483; H01L 33/486; H01L 2224/48091; H01L 2924/00014
USPC ...................................................... 257/98, 99
See application file for complete search history.

(56) References Cited

U.S. PATENT DOCUMENTS

| | | | |
|---|---|---|---|
| 3,197,726 A * | 7/1965 | Hulbert | 338/164 |
| 4,338,577 A * | 7/1982 | Sato et al. | 372/36 |
| 4,733,335 A | 3/1988 | Serizawa et al. | |
| 5,101,326 A | 3/1992 | Roney | |
| 5,296,724 A * | 3/1994 | Ogata et al. | 257/98 |

(Continued)

FOREIGN PATENT DOCUMENTS

| | | |
|---|---|---|
| JP | 2005-141919 A | 6/2005 |
| JP | 2005-294176 A | 10/2005 |

(Continued)

OTHER PUBLICATIONS

List of Potentially Related Pending U.S. Appl. No. 13/748,099 to Mika Mochizuki filed Jan. 23, 2013 and U.S. Appl. No. 13/791,888, filed Mar. 8, 2013.

*Primary Examiner* — Victor A Mandala
(74) *Attorney, Agent, or Firm* — Kenealy Vaidya LLP

(57) ABSTRACT

A semiconductor light-emitting device including a favorable radiating structure can include a semiconductor light source sealed between a metallic cap having a light-emitting window and a metallic base attached on a heat sink plate. The semiconductor light-emitting device can also include a holder attaching the metallic base along the metallic cap between the holder and the heat sink plate to efficiently radiate heat generated from the light source, and a thermal interface material layer disposed between at least a top surface of the heat sink plate and an outer bottom surface of the holder so as to be able to enlarge each tolerance of parts composing the light-emitting device. Thus, the disclosed subject matter can provide semiconductor light-emitting devices including the favorable radiating structure, which can be employed for various lighting apparatuses including a headlight in a relatively small size by selecting the semiconductor light source incorporated in the devices.

20 Claims, 9 Drawing Sheets

(56) References Cited

U.S. PATENT DOCUMENTS

| | | | |
|---|---|---|---|
| 5,359,208 A * | 10/1994 | Katsuki et al. | 257/82 |
| 6,273,596 B1 | 8/2001 | Parkyn, Jr. | |
| 6,850,001 B2 | 2/2005 | Takekuma | |
| 7,128,454 B2 | 10/2006 | Kim et al. | |
| 7,768,122 B2 * | 8/2010 | Oda | 257/710 |
| 8,575,637 B2 * | 11/2013 | Bae et al. | 257/98 |
| 2005/0068786 A1 | 3/2005 | Ishida | |
| 2005/0072985 A1 * | 4/2005 | Yamamoto | 257/99 |
| 2005/0094413 A1 | 5/2005 | Sazuka et al. | |
| 2005/0219856 A1 | 10/2005 | Tatsukawa | |
| 2006/0022213 A1 * | 2/2006 | Posamentier | 257/99 |
| 2008/0007961 A1 | 1/2008 | Mochizuki et al. | |
| 2010/0232173 A1 | 9/2010 | Ohno | |
| 2011/0249222 A1 | 10/2011 | Nakagawa et al. | |
| 2011/0249460 A1 | 10/2011 | Kushimoto | |
| 2011/0309388 A1 | 12/2011 | Ito | |
| 2012/0025218 A1 | 2/2012 | Ito | |
| 2012/0235169 A1 | 9/2012 | Seko | |
| 2013/0141922 A1 * | 6/2013 | Wakamiya et al. | 362/373 |
| 2013/0193458 A1 | 8/2013 | Mochizuki | |
| 2013/0242100 A1 | 9/2013 | Seki | |

FOREIGN PATENT DOCUMENTS

| | | |
|---|---|---|
| JP | 2006-172829 A | 6/2006 |
| JP | 2008-13014 A | 1/2008 |
| JP | 2010-219324 A | 9/2010 |
| JP | 2011-31807 A | 2/2011 |
| JP | 2011-31808 A | 2/2011 |
| JP | 2011-100785 A | 5/2011 |
| JP | 2011-221371 A | 11/2011 |
| JP | 2012-9760 A | 1/2012 |

* cited by examiner

FIG. 4  Comparative Embodiment

FIG. 5 Comparative Embodiment

SEMICONDUCTOR LIGHT-EMITTING DEVICE

This application claims the priority benefit under 35 U.S.C. §119 of Japanese Patent Application No. 2013-005129 filed on Jan. 16, 2013, which is hereby incorporated in its entirety by reference.

BACKGROUND

1. Field

The presently disclosed subject matter relates to Transistor Outlined Can-typed (To-Can-typed) semiconductor light-emitting devices, and more particularly to To-Can-typed semiconductor light-emitting devices including a favorable radiating structure, which can efficiently radiate heat generated from a semiconductor light source, and also can enable principal parts of the devices not to require a high processing accuracy.

2. Description of the Related Art

Recently, various Transistor Outlined Can-typed (To-Can-typed) semiconductor light-emitting devices have been developed to meet a market need of small semiconductor light-emitting devices at low cost. To-Can-typed semiconductor light-emitting devices are, for example, disclosed in patent document No. 1 (Japanese Patent Application Laid Open JP2011-100785). FIG. 8 is an enlarged perspective view showing a conventional To-Can-typed semiconductor light-emitting device, which is disclosed in patent document No. 1.

The conventional semiconductor light-emitting deice 50 includes: a metallic cap 51 having a light-emitting window 51a; a metallic base 52 having through holes mounting the metallic cap 51 thereon; terminal pins 53 being hermetically sealed in a respective one of the through holes of the metallic base 52, respectively; a semiconductor light-emitting chip 55 having electrodes such as a light-emitting diode chip, a laser diode and the like being mounted on the metallic base 52, and each of the electrodes being electrically connected to a respective one of the terminal pin 53 via a respect one of bonding wires 54 so that the semiconductor light-emitting chip 55 can emit light when the electrodes of the chip 55 receive a power supply via the terminal pins 53; and wherein the metallic cap 51 is attached to the metallic base 52 so that the semiconductor light-emitting chip 55 can be airproofed between the metallic cap 51 and the metallic base 52.

Thereby, the conventional semiconductor light-emitting deice 50 enables the semiconductor light-emitting chip 55 to avoid a failure resulting from moisture absorption and a contamination of outer air, and may emit light emitted from the semiconductor light-emitting chip 55 from the light-emitting window 51a in a direction toward an emission thereof.

When the conventional semiconductor light-emitting deice 50 is used as a light source for a projector and the like, which needs a large amount of light to clearly project image data and the like, the semiconductor light-emitting device 50 may be subject to high temperature. Accordingly, to use the semiconductor light-emitting device 50 as a light source for the projector and the like, a heat sink may be required to radiate heat generated from the semiconductor light-emitting chip 55. However, when the To-Can typed semiconductor light-emitting device 50 is attached to a heat sink, because the metallic cap 51 may be made from a thin metallic plate in a manufacturing method such as a press working in general, it may be difficult for the metallic cap 51 to employ as a favorable heat-conducting path for the heat sink.

In addition, it may also be difficult for the metallic base 52 to employ as a favorable heat-conducting path for the heat sink using a side surface of the metallic base 52, because the metallic base 52 may require a space around the side surface thereof to adjust an optical axis of the device 50 in a direction toward the emission of the device 50. Moreover, when a bottom surface of the metallic base 52 is used as a dominant heat-conducting path for the heat sink, because the terminal pins 53 extend in an opposite direction of the metallic cap 51 from the bottom surface of the metallic base 52, the bottom surface of the metallic base 52 may also be difficult to use as the dominant heat-conducting path for the heat sink.

Hence, a conventional To-Can typed semiconductor light-emitting device including a heat sink is disclosed in patent document No. 2 (Japanese Patent Application Laid Open JP2012-9760). FIG. 9 is an enlarged cross-sectional view showing the conventional To-Can-typed semiconductor light-emitting device including a heat sink, which is disclosed in patent document No. 2.

The conventional semiconductor light-emitting deice 60 having a heat sink 66 includes: a metallic cap 61 having a light-emitting window; a metallic base 62 having an top surface 62a, a bottom surface 62b and through holes mounting the metallic cap 61 on the top surface 62a thereof, and the through holes passing through the metallic base 62; terminal pins 63 being hermetically sealed in the metallic base 62 via a respective of the through holes, respectively, so that a semiconductor light-emitting chip can emit light from the light-emitting window of the metallic cap 61 when the terminal pins 63 receive a power supply, and wherein the metallic cap 61 is attached to the metallic base 62 so that the semiconductor light-emitting chip can be airproofed between the metallic cap 61 and the metallic base 62.

In addition, the conventional semiconductor light-emitting deice 60 also includes: the heat sink 66, which is composed of a base plate 66a having a bottom surface 66b and a top surface 66c and a radiating fin 66d attached to the bottom surface 66b of the base plate 66a, the top surface 66c contacting with the bottom surface 62b of the metallic base 62; a holder 64 having an outer bottom surface 64a and an inner bottom surface 64b formed in an L-shaped structure in a cross-sectional view, and attaching the metallic base 62 to the heat sink 66 along with the metallic cap 61 between the inner bottom surface 64b and the top surface 66c of the base plate 66a; and a thermal conductive elastic member 65 being located between a side surface of the metallic base 62 and an inner side surface of the holder 64, which is located between the outer bottom surface 64a and the inner bottom surface 64b of the holder 64 that is formed in the L-shaped structure.

In the conventional semiconductor light-emitting device 60, heat generated from the semiconductor light-emitting chip mounted in the metallic cap 61 sealed by the metallic base 62 may transmit through a first thermal conductive path P1 from the bottom surface 62b of the metallic base 62 toward the top surface 66c of the base plate 66a, through a second thermal conductive path P2 from the top surface 62a of the metallic base 62 toward the top surface 66c of the base plate 66a via the inner bottom surface 64b and the outer bottom surface 64a of the holder 64, and through a third thermal conductive path P3 from the side surface of the metallic base 62 toward the top surface 66c of the base plate 66a of the heat sink 66 via the thermal conductive elastic member 65 and the outer bottom surface 64a of the holder 65.

However, the conventional semiconductor light-emitting device 60 may require each shape of the metallic base 62, the holder 65 and the base plate 66a of the heat sink 66, which may relatively become large, to be formed in a substantially uniformed shape. Specifically, the bottom surface 62b of the metallic base 62 should correspond to a substantially same level as the outer bottom surface 64a of the holder 64, the top surface 62a of the metallic base 62 should correspond to a substantially same level as the inner bottom surface 64b of the holder 64, and also the top surface 66b of the base plate 66a of the heat sink 66 should correspond to a substantially same level as the outer bottom surface 64a of the holder 64.

Therefore, a structure of the conventional semiconductor light-emitting device 60 may not allow each shape of the metallic base 62, the holder 65 and the base plate 66a of the heat sink 66 to even include a small tolerance. The conventional structure must require a high processing accuracy with reference to each of the metallic base 62, the holder 65 and the base plate 66a of the heat sink 66, and therefore should be always subject to a use of manufacturing machines at high cost, a long manufacturing time, a high manufacturing cost, etc.

In addition, when the conventional semiconductor light-emitting device 60 is used as a light source for the projector such that projects image data on a screen provided in a room, a quantity of misalignment of the optical axis of the device 60 may be allowed because a distance between the projector and the screen may be relatively short, and also may be generally constant. However, when the conventional structure of the To-Can typed semiconductor light-emitting device 60 is used as a light source for a vehicle headlight, which is required to form a favorable light distribution pattern with a wide range under varied surrounds, the quantity of misalignment of the optical axis of the device 60 may not be allowed.

The above-referenced Patent Documents and additional Patent Documents are listed below and are hereby incorporated with their English specifications and abstracts in their entireties.
1. Patent document No. 1: Japanese Patent Application Laid Open JP2011-100785
2. Patent document No. 2: Japanese Patent Application Laid Open JP2012-9760
3. Patent document No. 3: US Patent Publication No. 2013-0193458 (Your Ref. ST3001-0374)
4. Patent document No. 4: US Patent Publication No. 2013-0242100 (Your Ref. ST3001-0378)

The disclosed subject matter has been devised to consider the above and other problems, characteristics and features. Thus, embodiments of the disclosed subject matter can include providing Transistor Outlined Can-typed (To-Can-typed) semiconductor light-emitting devices including a favorable radiating structure, which can efficiently radiate heat generated from a semiconductor light source sealed in the devices, and also can enable parts of the devices not to require a high processing accuracy. In this case, the semiconductor light source can emit various colored lights in a small size. Thus, the semiconductor light-emitting devices can result in an increase in the possible range of lighting design options, and therefore can be employed for various lighting apparatuses in a comparatively small size at low cost.

SUMMARY

The presently disclosed subject matter has been devised in view of the above and other characteristics, desires, and problems in the conventional art. Aspects of the disclosed subject matter can include providing semiconductor light-emitting devices including a favorable radiating structure for various vehicle lamps, in which a projector headlight can form a favorable light distribution pattern with a simple structure, and also can appropriately vary a favorable light distribution pattern in accordance with various circumstances such as a load condition and the like by selecting a semiconductor light source incorporated in the light-emitting devices.

According to an aspect of the disclosed subject matter, a semiconductor light-emitting device can include: a metallic cap including a light-emitting window, made from a metallic plate, and formed in a substantially circular cylindrical shape that overlaps a first circular cylinder on a second circular cylinder, in which an inner diameter of the first circular cylinder is smaller than that of the second circular cylinder, and the light-emitting window made of a transparent material is sealed using the metallic plate of the first circular cylinder; a metallic base having through holes made from a metallic plate, and formed in a substantially planar shape, wherein a top surface thereof includes an outer circumference, and also mounting the metallic cap thereon so as to expose the outer circumference thereof from the metallic cap; terminal pins being hermetically sealed in a respective one of the through holes of the metallic base, respectively, and extending in an opposite direction of the top surface of the metallic base; and a semiconductor light source mounted on the top surface of the metallic base, being airproofed between the metallic cap and the metallic base, a light-emitting surface thereof facing the light-emitting window of the metallic cap, an optical axis thereof intersecting with the light-emitting window of the metallic cap at a substantially right angle, and thereby operating as an optical axis of the light-emitting device, and electrodes thereof being electrically connected to a respective one of the terminal pins, respectively.

In addition, the semiconductor light-emitting device can also include: a heat sink plate having a bottom surface, and a top surface thereof contacting with the bottom surface of the metallic base; a holder having a body including an inner bottom surface and an inner side surface, attaching the metallic base on the top surface of the heat sink plate along with the metallic cap between the inner bottom surface of the body thereof and the top surface of the heat sink plate, and therefore the inner bottom surface of the body contacting with at least the outer circumference of the top surface of the metallic base, a first flange thereof extending in an opposite direction of the metallic base from the body along the heat sink plate and a second flange thereof also extending toward the first circular cylinder from the body over the second circular cylinder of the holder in the cross-sectional view taken along the optical axis of the device; a thermal interface material (TIM) layer disposed between the top surface of the heat sink plate and the outer bottom surface of the holder; and a thermal conductive elastic member disposed between a side surface of the metallic base and the inner side surface of the body of the holder.

According to another aspect of the disclosed subject matter, the above-described semiconductor light-emitting device can be configured to basically remove the first circular cylinder of the metallic cap and the second flange of the holder adjacent to the first circular cylinder, and thereby can be configured to move the light-emitting window of the metallic cap from the first circular cylinder to the second circular cylinder of the holder.

In the above-described exemplary semiconductor light-emitting devices, the TIM layer can be made from one of a thermal conductive grease and a thermal conductive sheet, and also can include a thermal conductive silicone. The thermal conductive elastic member can be made from one of an acrylic rubber series and a thermoplastic elastomer series. The metallic cap can be made from an alloyed material based upon Iron (Fe), the metallic base can also be made from an alloyed material based upon Iron (Fe), and therefore the metallic cap and the metallic base can be made from a substantially same material. Additionally, the devices can further include screws to attach the metallic base on the top surface of the heat sink plate along with the metallic cap between the inner bottom surface of the body of the holder and the top surface of the heat sink plate, and also can further include a radiating fin, which is located on the bottom surface of the heat sink plate so as to extend from the bottom surface of the heat sink plate in an opposite direction of the top surface of the heat sink plate in order to further improve a radiating efficiency.

According to the above-described exemplary LED optical units, because the heat generated from the semiconductor light source 4 can efficiently radiate through a first thermal path P1, a second thermal path P2 and a third thermal path P3, as shown in FIG. 1 and FIG. 7a, the structure of the disclosed subject matter can provide To-Can typed semiconductor light-emitting devices having a high-radiating efficiency. In addition, the structure may not necessarily require each shape of the metallic base, the holder and the heat sink plate to be formed in a uniformed shape, and therefore can allow each shape of the metallic base, the holder and the heat sink plate to include a relatively large tolerance as compared with the conventional structure described above.

Moreover, the semiconductor light source can emit various colored lights including light having a substantially white color tone in a small size, and also emit lights in various directions by using a plurality of light-emitting chips. Thus, the semiconductor light-emitting devices can result in an increase in the possible range of lighting design options, and therefore can be employed for various lighting apparatuses in a comparatively small size at low cost. Furthermore, the disclosed subject matter can also include providing semiconductor light-emitting devices including a favorable radiating structure for various vehicle lamps, in which a projector headlight can form a favorable light distribution pattern with a simple structure, and also can appropriately vary a favorable light distribution pattern in accordance with various circumstances such as a load condition and the like by selecting the semiconductor light source incorporated in the light-emitting devices

BRIEF DESCRIPTION OF THE DRAWINGS

These and other characteristics and features of the disclosed subject matter will become clear from the following description with reference to the accompanying drawings, wherein.

DETAILED DESCRIPTION OF EXEMPLARY EMBODIMENTS

Figure 1:
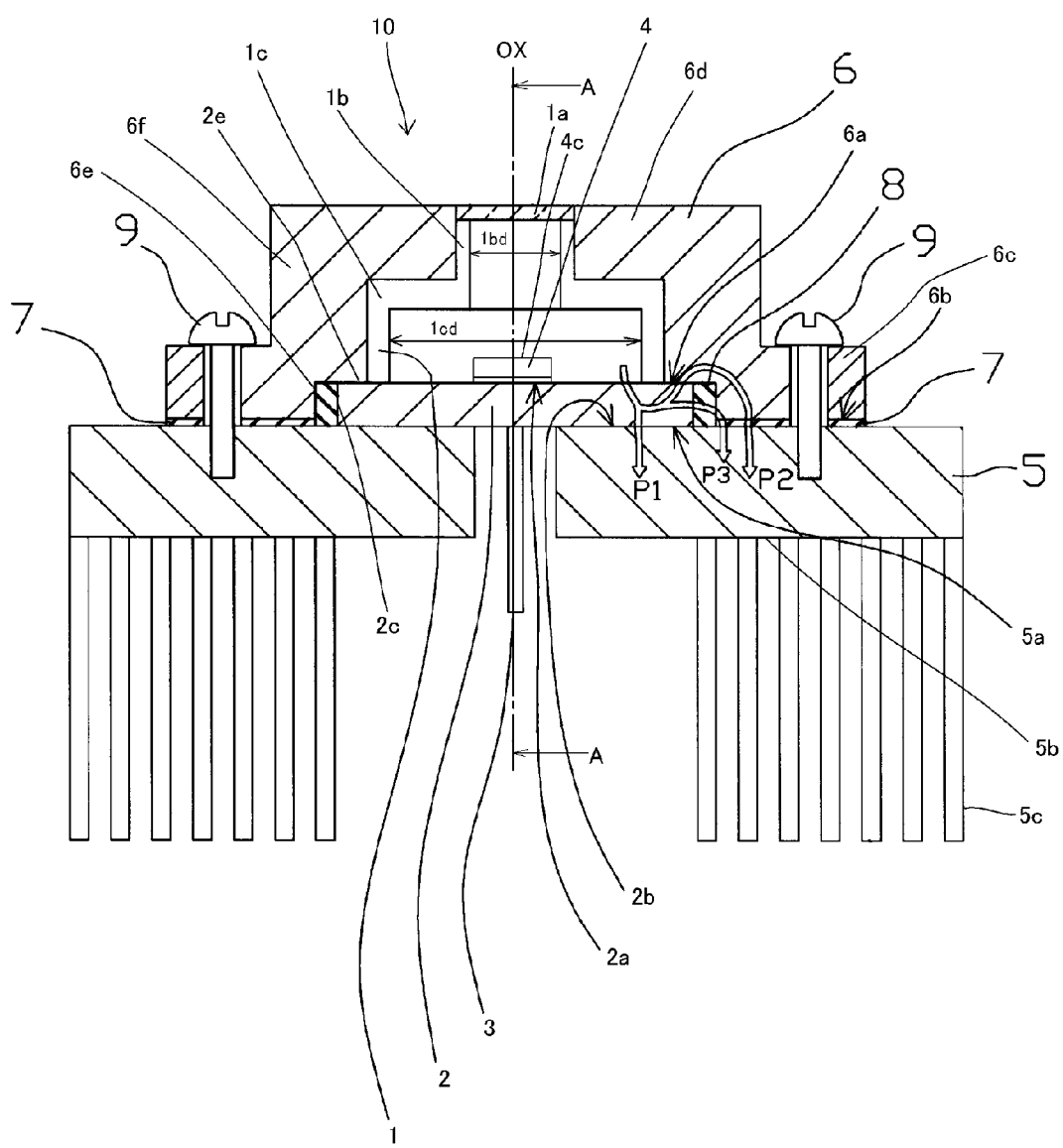
FIG. 1 is an enlarged cross-sectional view showing a first exemplary embodiment of a semiconductor light-emitting device made in accordance with principles of the disclosed subject matter.

The disclosed subject matter will now be described in detail with reference to FIGS. 1 to 7b, in which the same or corresponding elements use the same reference marks. FIG. 1 is an enlarged cross-sectional view showing a first exemplary embodiment of a semiconductor light-emitting device made in accordance with principles of the disclosed subject matter.

The semiconductor light-emitting deice 10 can include a metallic cap 1 including a light-emitting window 1a, a first circular cylinder 1b having a first inner diameter 1bd and a second circular cylinder 1c having a second inner diameter 1cd, made from a metallic plate such as an alloyed material based upon Iron (Fe), formed in a substantially circular cylindrical shape, which overlaps the first circular cylinder 1b on the second circular cylinder 1c, in which the first inner diameter 1bd of the first circular cylinder 1b is slightly smaller than the second inner diameter 1cd of the second circular cylinder 1c, the light-emitting window 1a is made of a transparent material such as a glass, a transparent resin, a lens made from a glass or a transparent resin, and is sealed between the light-emitting window 1a and the first circular cylinder 1b using a sealing method such as a thermal adhesion, an adhesive joining, a swage, etc.

In addition, the semiconductor light-emitting deice 10 can also include; a metallic base 2 having a top surface 2a, a bottom surface 2b, a side surface 2c and through holes 2d (described in FIG. 2a) made from a metallic plate such as an alloyed material based upon Iron (Fe), and formed in a substantially planar shape, the top surface 2a of metallic base 2 including an outer circumference 2e, and also mounting the metallic cap 1 on the top surface 2a so as to expose the outer circumference 2e of the top surface 2a from the metallic cap 6; terminal pins 3 being hermetically sealed in a respective one of the through holes 2d of the metallic base 2, respectively; and a semiconductor light source 4 having a light-emitting surface 4c and an optical axis OX mounted on the top surface 2a of the metallic base 2, and being airproofed between the metallic cap 1 and the metallic base 2, the light-emitting surface 4c of the semiconductor light source 4 facing the light-emitting window 1a of the metallic cap 1, the optical axis OX thereof intersecting with a substantially center of the light-emitting window 1a of the metallic cap 1 at a substantially right angle in order to be able to correspond to an optical axis OX of the device 10.

Moreover, the semiconductor light-emitting deice 10 can also include: a heat sink plate 5 having a top surface 5a and a bottom surface 5b, in which a radiating fin 5c may extend from the bottom surface 5b in an opposite direction of the top surface 5a to improve a heat-radiating efficiency, the top surface 5a thereof contacting with the bottom surface 2b of the metallic base 2 to enjoy a more improved heat-radiating efficiency; and a holder 6 having an inner bottom surface 6a, an outer bottom surface 6b, a first flange 6c, a second flange 6d, an inner side surface 6e and a body 6f including the inner bottom surface 6a and the inner side surface 6e, attaching the metallic base 2 on the top surface 5a of the heat sink plate 5 along with the metallic cap 1 between the inner bottom surface 6a of the holder 6 and the top surface 5a of the heat sink plate 5 via screws 9, in which the first flange 6c extends in an opposite direction of the metallic base 2 from the body 6f along the heat sink plate 5 in a cross-sectional view taken along the optical axis OX of the device 10 and the second flange 6d extends toward the first circular cylinder 1b from the body 6f in the cross-sectional view taken along the optical axis OX of the device 10, the inner bottom surface 6a of the body 6f contacting with at least the outer circumference 2e of the top surface 2a of the metallic base 2.

Furthermore, the semiconductor light-emitting deice 10 can also include: a thermal interface material (TIM) layer 7 being disposed between the top surface 5a of the heat sink plate 5 and the outer bottom surface 6b of the holder 6 to enable the heat sink plate 5 to enlarge a tolerance of the top surface 5a thereof and so as to enable the holder 6 to enlarge a tolerance of the outer bottom surface 6b of the holder 6; and a thermal conductive elastic member 8 between the side surface 2c of the metallic base 2 and the inner side surface 6e of the body 6f of the holder 6, which is located between the outer bottom surface 6b and the inner bottom surface 6a of the holder 6 that includes the first flange 6c located on the TIM layer 7 and the second flange 6d, which extends in an opposite direction of the first flange 6c.

The TIM layer 7 can be an adhesive layer having a high thermal conductivity. Specifically, the TIM layer 7 can be made from a thermal conductive grease including a thermal conductive silicone or a thermal conductive sheet including a thermal conductive silicone. The thermal conductive elastic member 8 can be made from an acrylic rubber series, a thermoplastic elastomer series, etc. Additionally, when the metallic cap 1 and the metallic base 2 are made of a substantially same material, because each of thermal expansion coefficients of the metallic cap 1 and the metallic base 2 is a substantially same, the semiconductor light-emitting device 10 can easily prevent peeling between the metallic cap 1 and metallic base 2.

Figure 2A:
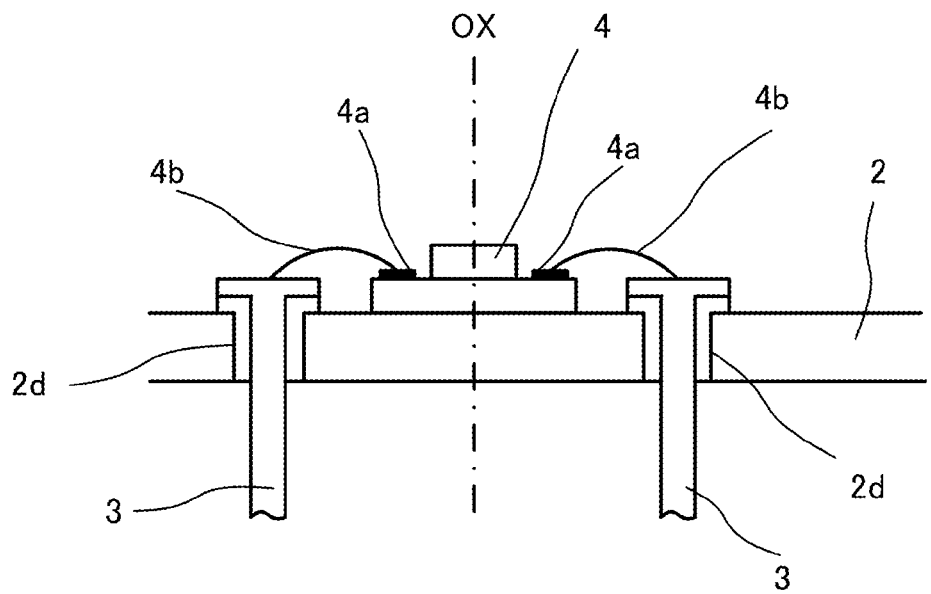
FIGS. 2a and 2b are an enlarged cross-sectional side view of an exemplary semiconductor light source taken along line A-A in the semiconductor light-emitting device of FIG. 1, and an enlarged top view of the exemplary semiconductor light source.
Figure 2B:
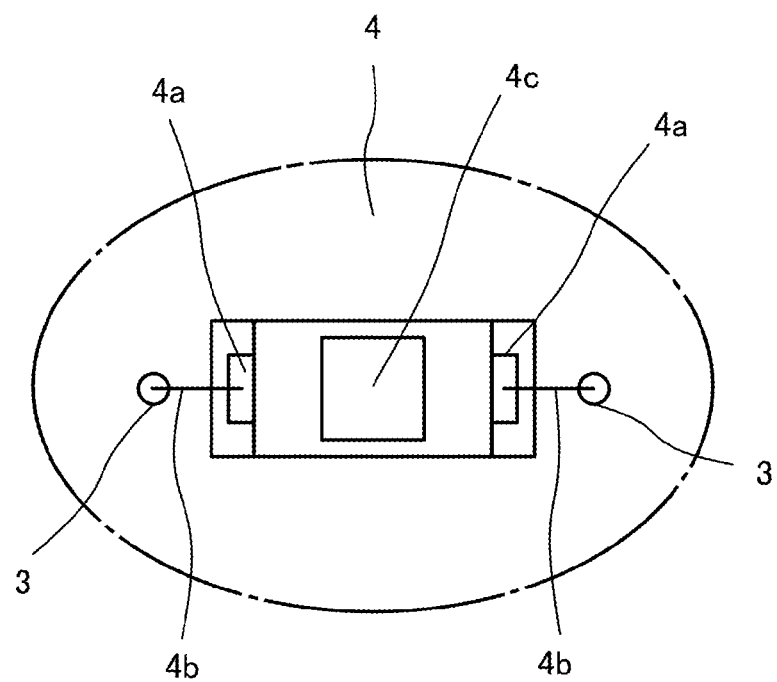

The semiconductor light source 4 will now be described with reference to FIGS. 2a and 2b, which are an enlarged cross-sectional side view of an exemplary semiconductor light source taken along line A-A in the semiconductor light-emitting device 10 of FIG. 1, and an enlarged top view of the exemplary semiconductor light source. The semiconductor light source 4 modifies a semiconductor light source device, which is disclosed in Patent document No. 3. Especially, electrodes of the semiconductor light source device and associated potions are modified to suit needs for the To-Can typed semiconductor light-emitting device 10. Accordingly, the semiconductor light source 4 can emit various colored lights including light having a white color tone, which can be used as a light source for a vehicle headlight, a projector, a general lighting, a stage lighting, etc.

The semiconductor light source 4 can include electrodes 4a to receive a power supply. Each of the electrodes 4a of the semiconductor light source 4 can be electrically connected to a respect one of the terminal pins 3, which is hermetically sealed in the respective one of the through holes 2d of the metallic base 2 to be isolated from the metallic base 2 using a field through (dielectric material) that is composed of a glass, a ceramic and the like, via a respect one of bonding wires 4b. Therefore, when the terminal pins 3 are provided with a power supply, the semiconductor light source 4 can emit various color lights from the light-emitting window 1a of the metallic cap 1 in a direction toward a light-emission of the device 10.

The semiconductor light source 4 generates a heat in accordance with an amount of the power supply. Accordingly, the semiconductor light-emitting device 10 can enable the semiconductor light source 4 to emit stable light with high efficiency and long life by efficiently radiating the heat generated from the semiconductor light source 4.

According to a structure of the semiconductor light-emitting device 10, the heat generated from the semiconductor light source 4 can radiate through a first thermal path P1, which moves from the metallic base 2 toward the top surface 5a of the heat sink plate 5 contacting with the bottom surface 2b of the metallic base 2, through a second thermal path P2, which moves from the top surface 2a of the metallic base 2 toward the top surface 5a of the heat sink plate 5 contacting with the TIM layer 7 via the outer bottom surface 6b of the holder 6 and the TIM layer 7, and though a third thermal path P3, which moves from the side surface 2c of the metallic base 2 toward the top surface 5a of the heat sink plate 5 via at least one of the thermal conductive elastic member 8, the holder 6 and the TIM layer 7, as shown in FIG. 1.

In this case, a contribution ratio of the thermal conductivity may increase in order of P1, P2 and P3, and the contribution of the thermal conductivity through the first thermal path P1, where is close to the semiconductor light source 4 that is only a thermal source of the device 10, can be the highest ratio in the three paths P1, P2 and P3. Accordingly, the structure of the disclosed subject matter can provide the To-Can typed semiconductor light-emitting device having a high-radiating efficiency.

In addition, the structure may not necessarily require each shape of the metallic base 2, the holder 6 and the heat sink plate 5, which may comparatively become large, to be formed in a uniformed shape. More specifically, the bottom surface 2b of the metallic base 2 may not necessarily correspond to the same level as the outer bottom surface 6b of the holder 6, because the TIM layer 7 is disposed between the outer bottom surface 6b of the holder 6 and the top surface 5a of the heat sink plate 5.

Moreover, the top surface 2a of the metallic base 2 may not necessarily correspond to the substantially same level as the inner bottom surface 6a of the holder 6, because the thermal conductive elastic member 8 is located between the side surface 2c of the metallic base 2 and the outer side surface 6e of the holder 6. Furthermore, the top surface 5a of the heat sink plate 5 may also not necessarily correspond to the same level as the outer bottom surface 6b of the holder 6, because the TIM layer 7 is disposed between the outer bottom surface 6b of the holder 6 and the top surface 5a of the heat sink plate 5 and also because the thermal conductive elastic member 8 is located between the side surface 2c of the metallic base 2 and the outer side surface 6e of the holder 6.

Therefore, the structure of the semiconductor light-emitting device 10 can allow each shape of the metallic base 2, the holder 6 and the heat sink plate 5 to include a relatively large tolerance as compared with the conventional structure described above, and may not necessarily require a high processing accuracy with reference to each of the metallic base 2, the holder 6 and the heat sink plate 5. Thus, the structure of the disclosed subject matter can result in a use of general manufacturing machines, a comparatively short manufacturing time and a relatively low manufacturing cost while enjoying a high thermal-radiating efficiency.

Figure 3:
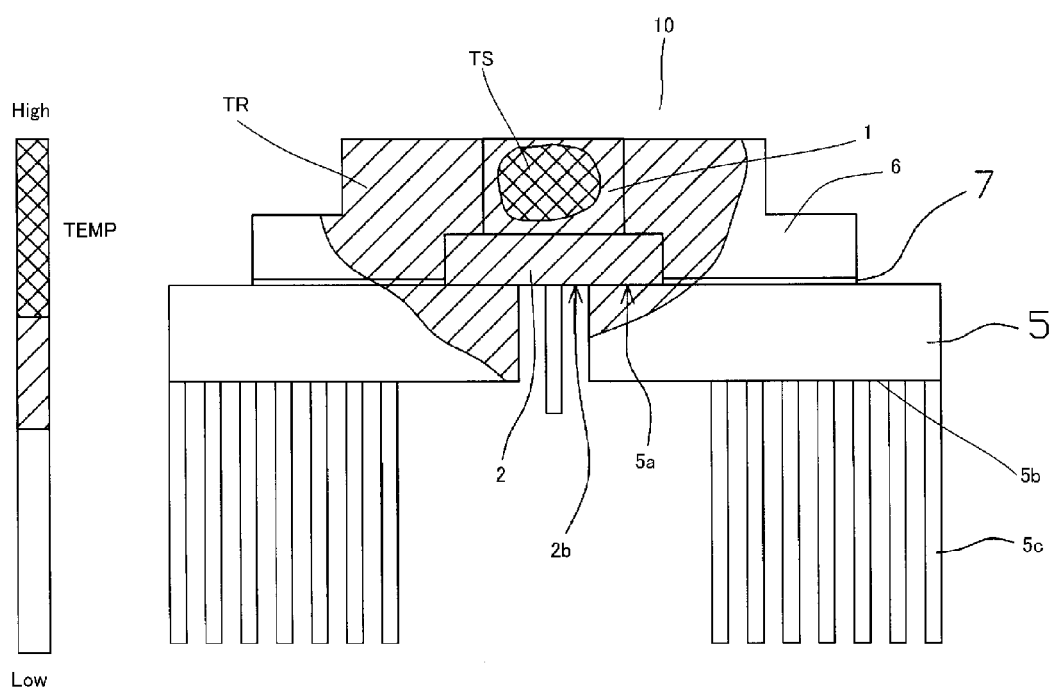
FIG. 3 is an enlarged side view depicting a temperature distribution of a thermal conductive state in the semiconductor light-emitting device of FIG. 1 during operation.

FIG. 3 is an enlarged side view depicting a temperature distribution of a thermal conductive state in the semiconductor light-emitting device 10 during operation. The heat generated from the semiconductor light source 4 can form a substantially same temperature region TR (shadow area shown in FIG. 3) with a wide range of the semiconductor light-emitting device 10, and the substantially same temperature region TR can expand from the bottom surface 2b of the metallic base 2 toward the top surface 5a of the heat sink plate 5. Therefore, a high temperature region TS formed by the semiconductor light-emitting device 10 can be formed in a relatively small shape, and also the heat generated from the semiconductor light-emitting device 10 can efficiently radiate from the heat sink plate 5 and the radiating fin 5c, which extends in an opposite direction of the top surface 5a from the bottom surface 5b of the heat sink plate 5.

Figure 4:
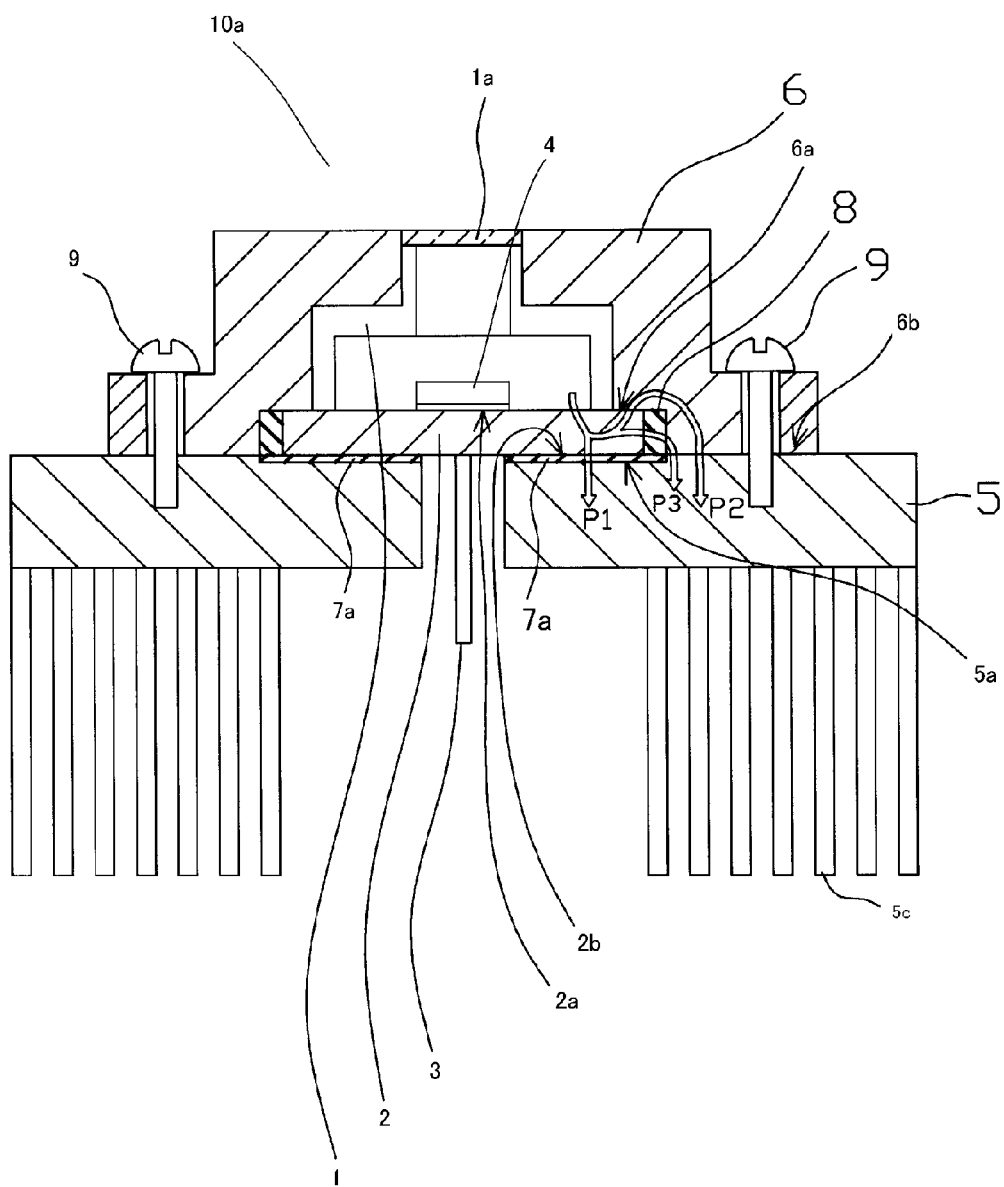
FIG. 4 is an enlarged cross-sectional view showing a comparative embodiment of the semiconductor light-emitting device.

Here, a comparative embodiment is shown in FIG. 4 to evaluate the heat-radiating efficiency of the semiconductor light-emitting device 10. The comparative embodiment 10a includes the metallic cap 1 having a light-emitting window 1a, the metallic base 2 mounting the metallic cap 1 on the top surface 2a, the terminal pins 3, the semiconductor light source 4, the heat sink plate 5 and the holder 6, wherein the inner bottom surface 6a of the holder 6 contacts with the top surface 2a of the metallic base 2, in common with the semiconductor light-emitting device 10 shown in FIG. 1.

However, in the comparative embodiment 10a, the outer bottom surface 6b of the holder 6 directly contacts with the top surface 5a of the heat sink plate 5 while the TIM layer 7a is disposed between the bottom surface 2b of the metallic base 2 and the top surface 5a of the heat sink plate 5 so that a tolerance between the bottom surface 2b of the metallic base 2 and the top surface 5a of the heat sink plate 5 can be enlarged.

According to a structure of the comparative embodiment 10a, heat generated from the semiconductor light source 4 may radiate through the first thermal path P1, which moves from the metallic base 2 toward the top surface 5a of the heat sink plate 5 via the TIM layer 7a, through the second thermal path P2, which moves from the top surface 2a of the metallic base 2 toward the top surface 5a of the heat sink plate 5 via the inner bottom surface 6a and the outer bottom surface 6b of the holder 6, and though the third thermal path P3, which moves from the side surface 2c of the metallic base 2 toward the top surface 5a of the heat sink plate 5 via at least one of the thermal conductive elastic member 8, the holder 6 and the TIM layer 7a, as shown in FIG. 4.

Also in the structure of the comparative embodiment 10a, each shape of the metallic base 2, the holder 6 and the heat sink plate 5 may not necessarily be required to be formed in a uniformed shape as is the case in the first embodiment shown in FIG. 1. However, the contribution ratio of the thermal conductivity may increase in order of P2, P1 and P3, because the TIM layer 7a is disposed between the bottom surface 2b of the metallic base 2 and the top surface 5a of the heat sink plate 5 and because the TIM layer 7a is not disposed between the outer bottom surface 6b of the holder 6 and the top surface 5a of the heat sink plate 5 unlike the case of the first embodiment.

Figure 5:
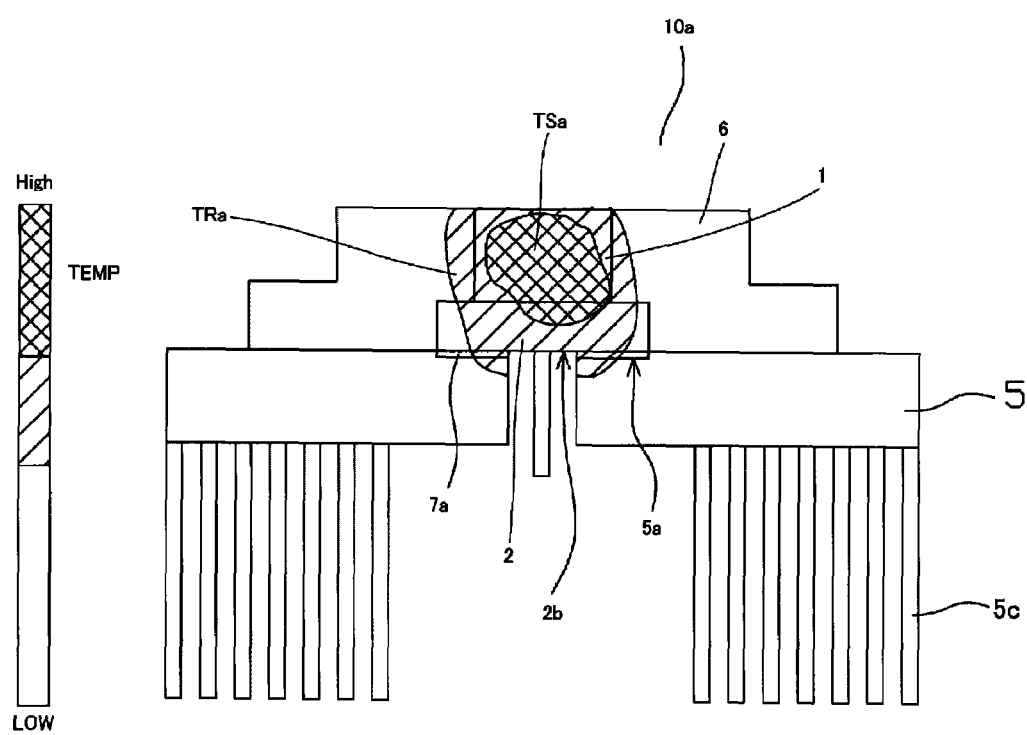
FIG. 5 is an enlarged side view depicting a temperature distribution of a thermal conductive state in the comparative embodiment of the semiconductor light-emitting device of FIG. 4 during operation.

FIG. 5 is an enlarged side view depicting a temperature distribution of a thermal conductive state in the comparative embodiment 10a during operation. A heat generated from the semiconductor light source 4 of the comparative embodiment 10a forms a substantially same temperature region TRa (shadow area shown in FIG. 5) with a narrow range as compared with the semiconductor light-emitting device 10 of the first embodiment, and the substantially same temperature region TRa may not widely expand from the whole bottom surface 2b of the metallic base 2 toward the top surface 5a of the heat sink plate 5.

Therefore, a high temperature region TSa formed by the semiconductor light-emitting device 10a of the comparative embodiment may be formed in a comparatively large shape so as to stay between the metallic cap 1 and the metallic base 2 as compared with the case of the semiconductor light-emitting device 10 of the first embodiment. The heat generated from the semiconductor light-emitting device 10a may not efficiently radiate from the heat sink plate 5 and the radiating fin 5c, which is located on the bottom surface 5b of the heat sink plate 5, as compared with that generated from the semiconductor light-emitting device 10 of the first embodiment.

Figure 6:
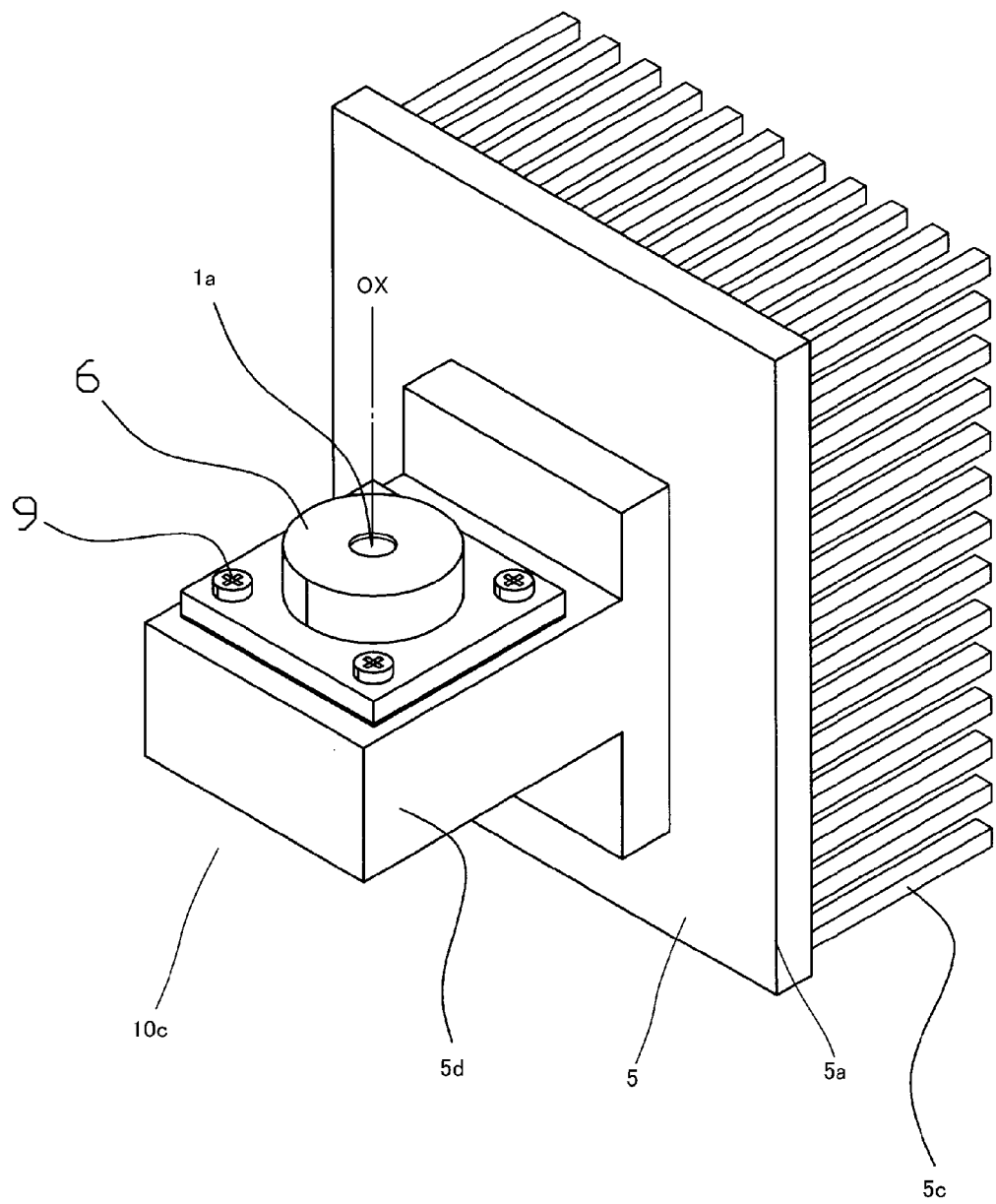
FIG. 6 is an enlarged perspective view showing an exemplary variation of the first embodiment of the semiconductor light-emitting device shown in FIG. 1.

An exemplary variation of the semiconductor light-emitting device 10 will now be described with reference to FIG. 6. When the semiconductor light-emitting device 10 is used as a light source for a projector lamp, for exemplary, which is disclosed in FIG. 4 of Patent document No. 3, because the light-emitting window 1a of the metallic cap 1 faces a projector lens, the projector lamp may be subject to a long shape in a direction toward a light-emission of the projector lamp. When the projector lamp is required to be formed in a short shape toward the light-emission of the projector lamp, the semiconductor light-emitting device 10c shown in FIG. 6 may be useful to reduce a length of the projector lamp.

A difference between the semiconductor light-emitting devices 10c and 10 of the first embodiment relates to a second heat sink plate 5d, which is added in the semiconductor light-emitting device 10c. The second heat sink plate 5d can be formed as an L-plate or a T-shaped plate as shown in FIG. 6. Accordingly, an optical axis OX of the semiconductor light-emitting device 10c can be substantially parallel to the top surface 5a of the heat sink plate 5, although the optical axis OX of the semiconductor light-emitting device 10 of the first embodiment can be substantially perpendicular to the top surface 5a of the heat sink plate 5.

Hence, the radiating fin 5c can extend in a direction substantially perpendicular to the optical axis OX in the semiconductor light-emitting device 10c. When the semiconductor light-emitting device 10c is used as a light source for the above-described projector lamp, in which the optical axis OX of the device 10c basically corresponds to an optical axis of the projector lens, because the radiating fin 5c can extend in the direction substantially perpendicular to the optical axis OX of the device 10c, the projector lamp can reduce a length in a direction toward the light-emission of the projector lamp as compared with the case that the semiconductor light-emitting device 10 of the first embodiment is used as a light source.

In the above-described semiconductor light-emitting devices 10 and 10c, when the semiconductor light source device disclosed in Patent document No. 3 is used as the light source 4, the semiconductor light source 4 can emit various color lights having a substantially uniform color tone and a high light-emitting efficiency from a small light-emitting surface. Consequently, the semiconductor light-emitting devices 10 and 10c can result in an increase in the possible range of lighting design options, and therefore can be employed for various lighting apparatuses in a comparatively small size at low cost.

In addition, when the semiconductor light-emitting devices 10 and 10c are used as a light source for a headlight, because each of the semiconductor light-emitting devices 10 and 10c can emit white light having a substantially uniform color tone and a high light-emitting efficiency from a small light-emitting surface, the headlight can provide a favorable light distribution pattern with a simple structure. Moreover, the light-emitting window 1a of the metallic cap 1 can be configured with a lens having a comparatively long focal length, and therefore may operate as a projector lens for the projector lamp, which is disclosed in FIG. 4 of Patent document No. 3, depending on a light distribution pattern required for the projector lamp.

Figure 7A:
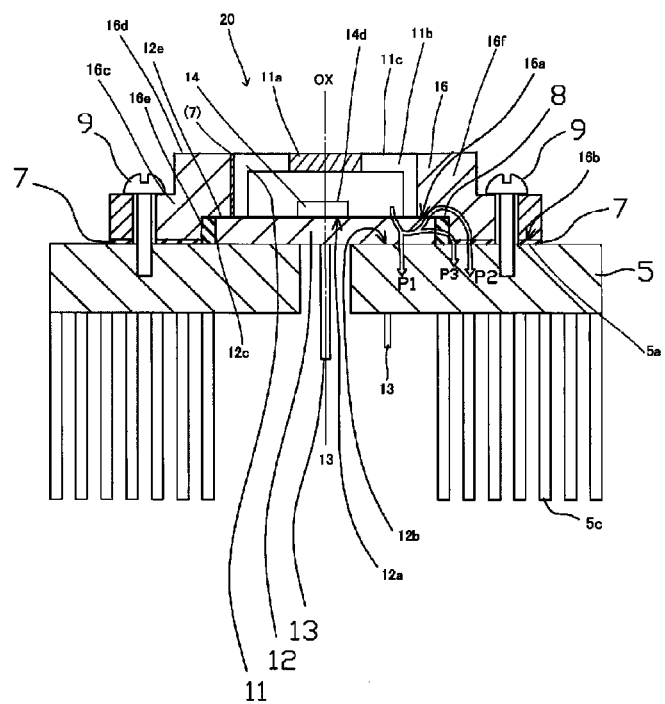
FIG. 7a is an enlarged cross-sectional view showing a second exemplary embodiment of the semiconductor light-emitting device made in accordance with principles of the disclosed subject matter.
Figure 7B:
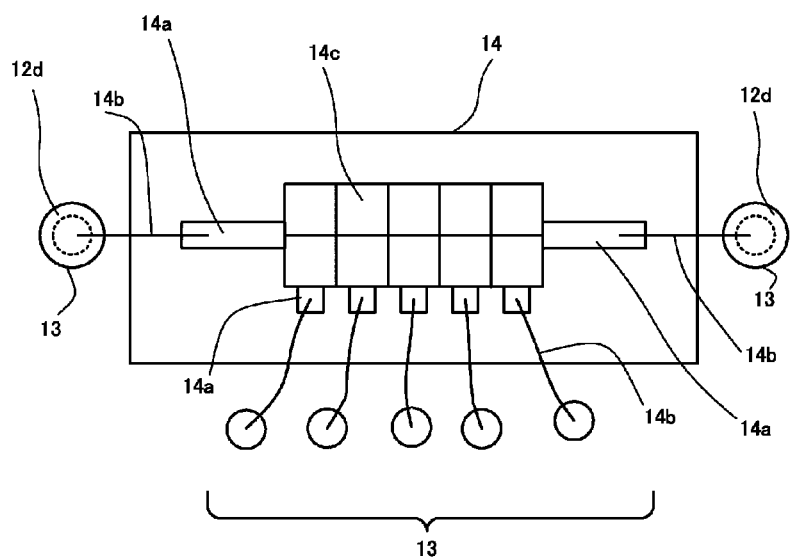
FIG. 7b is an enlarged top view showing another exemplary semiconductor light source for the semiconductor light-emitting device made in accordance with principles of the disclosed subject matter.
Figure 8:
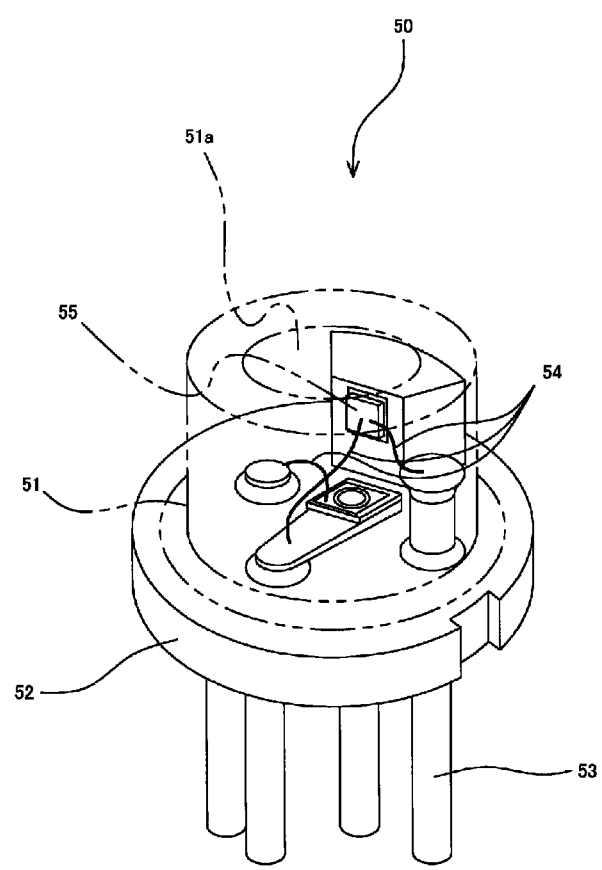
FIG. 8 is an enlarged perspective view showing a conventional To-Can-typed semiconductor light-emitting device.
Figure 9:
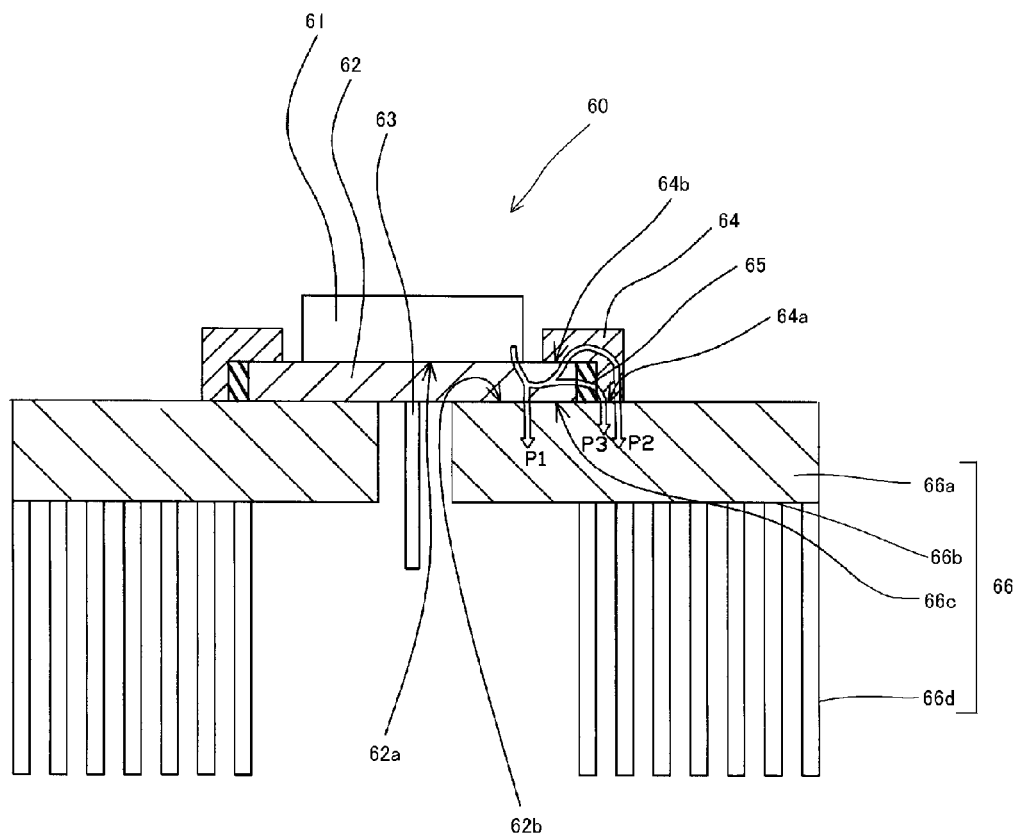
FIG. 9 is an enlarged cross-sectional view showing a conventional To-Can-typed semiconductor light-emitting device including a heat sink.

Next, a second exemplary embodiment of the semiconductor light-emitting device will now described with reference to FIG. 7a and FIG. 7b. FIG. 7a is an enlarged cross-sectional view showing the second embodiment of the semiconductor light-emitting device made in accordance with principles of the disclosed subject matter, and FIG. 7b is an enlarged top view of another exemplary semiconductor light source for the semiconductor light-emitting device. A difference between the second embodiment and the first embodiment does not basically include the first circular cylinder 1b of the metallic cap 1 and the second flange 6d of the holder 6 adjacent to the first circular cylinder 1b in the semiconductor light-emitting device 20 of the second embodiment.

More specifically, the semiconductor light-emitting deice 20 can include: a metallic cap 11 having a light-emitting window 11a and a top plate 11b made from a metallic plate such as an alloyed material based upon Iron (Fe), formed in a substantially circular cylindrical shape, in which the light-emitting window 11a is made of a transparent material such as a glass, a transparent resin, a lens made from a glass or a transparent resin, and is sealed between the light-emitting window 11a and the top plate 11b using a sealing method such as a thermal adhesion, an adhesive joining, a swage, etc.; a metallic base 12 having a top surface 12a, a bottom surface 12b, a side surface 12c and through holes 12d (a same structure as the through holes 2d shown in FIG. 2a) made from a metallic plate such as an alloyed material based upon Iron (Fe), formed in a substantially planar shape, the top surface 12a of metallic base 12 including an outer circumference 12e, and also mounting the metallic cap 11 on the top surface 12a of the metallic base 12 so as to expose the outer circumference 12e of the top surface 12a from the metallic cap 11; and terminal pins 13 being hermetically sealed in a respective one of the through holes 12d of the metallic base 12, respectively.

In addition, the semiconductor light-emitting deice 20 can also include a semiconductor light source 14 having a light-emitting surface 14c and an optical axis OX mounted on the top surface 12a of the metallic base 12, being airproofed between the metallic cap 11 and the metallic base 12, the light-emitting surface 14c thereof facing the light-emitting window 11a of the metallic cap 11, and the optical axis OX thereof intersecting with a substantially center of the light-emitting window 11a of the metallic cap 11 at a substantially right angle in order to be able to cooperate to an optical axis OX of the device 20.

Moreover, the semiconductor light-emitting deice 20 can also include: the heat sink plate 5 having a substantially same structure as the first embodiment; and a holder 16 having an inner bottom surface 16a, an outer bottom surface 16b, a flange 16c, a top surface 16d, an inner side surface 16e and a body 16f including the inner bottom surface 16a and the inner side surface 16e, attaching the metallic base 12 on the top surface 5a of the heat sink plate 5 along with the metallic cap 11 between the inner bottom surface 16a of the holder 16 and the top surface 5a of the heat sink plate 5 via screws 9, and therefore the inner bottom surface 16a thereof contacting with the top surface 12a of the metallic base 12, and the first flange 16c thereof extending in an opposite direction of the metallic base 12 along the heat sink plate 5 in a cross-sectional view taken along the optical axis OX of the light-emitting device 20.

Furthermore, the semiconductor light-emitting deice 20 can also include: the thermal interface material (TIM) layer 7 being disposed between the top surface 5a of the heat sink plate 5 and the outer bottom surface 16b of the holder 16 to enable the heat sink plate 5 to enlarge a tolerance of the top surface 5a thereof and so as to enable the holder 16 to enlarge a tolerance of the outer bottom surface 16b of the holder 16; and the thermal conductive elastic member 8 between the side surface 12c of the metallic base 12 and the inner side surface 16e of the holder 16, which is located between the outer bottom surface 16b and the inner bottom surface 16a of the holder 16 that includes the flange 16c located on the TIM layer 7. In this case, the top surface 16d of the holder 16 can be a substantially same level as a top surface 11c of the metallic cap 11, and also may be lower (toward the bottom surface 16b) than the top surface 11c of the metallic cap 11.

The semiconductor light source 14 will now be described with reference to FIG. 7b, which is an enlarged cross-sectional side view showing another exemplary semiconductor light source. The semiconductor light source 14 modifies a light-emitting unit, which is disclosed (as Mark 30) in Patent document No. 4. Especially, electrodes of the light-emitting unit and associated potions are modified to suit needs for the To-Can typed semiconductor light-emitting device 20, in which each of electrodes 14a of the semiconductor light source 14 is electrically connected to a respective one of the terminal pins 13 via a respective one of bonding wires 14b. Accordingly, because the semiconductor light source 14 can provide various light distribution patterns, when the semiconductor light-emitting device 20 is used as a light source for a headlight, the headlight can appropriately vary a favorable light distribution pattern in accordance with various circumstances such as a load condition and the like.

According to a structure of the semiconductor light-emitting device 20, heat generated from the semiconductor light source 14 can radiate through the first thermal path P1, the second thermal path P2 and the third thermal path P3, as described above with reference to FIG. 1. Accordingly, the structure of the second embodiment can also provide the To-Can typed semiconductor light-emitting device having a high-radiating efficiency, and a also can allow each shape of the metallic base 12, the holder 16 and the heat sink plate 5 to include a relatively large tolerance, because the structure may not necessarily require a high processing accuracy of each of the metallic base 12, the holder 16 and the heat sink plate 5 as compared with the conventional structure described above.

Accordingly, the structure of the second embodiment of the disclosed subject matter can also result in a use of general manufacturing machines, a comparatively short manufacturing time and a relatively low manufacturing cost while enjoying a high thermal-radiating efficiency. In addition, the structure can form the light-emitting window 11a in a comparatively large shape as compared with that of the first embodiment, and therefore can enable the semiconductor light source 14 to enlarge the light-emitting surface 14c. Thus, when the semiconductor light-emitting device 20 is used as a light source for the headlight, the headlight can appropriately vary a favorable light distribution pattern in accordance with various circumstances such as a load condition and the like by using the semiconductor light source 14 having a plurality of semiconductor light-emitting chips.

Various modifications of the above disclosed embodiments can be made without departing from the spirit and scope of the presently disclosed subject matter. For example, the TIM lay 7 can be disposed in at least a potion between the body 16f of the holder 16 and the metallic cap 11 as shown by mark (7) in FIG. 7a, and also can be disposed in at least a portion between the body 6f of the holder 6 and the metallic cap 1 of the first embodiment. In addition, the semiconductor light-emitting device 20 of the second embodiment can add the second heat sink plate 5d as shown in FIG. 6, and cannot be limited to the semiconductor light source 14 shown in FIG. 7b, as a semiconductor light source incorporated into the light-emitting device 20.

While there has been described what are at present considered to be exemplary embodiments of the invention, it will be understood that various modifications may be made thereto, and it is intended that the appended claims cover such modifications as fall within the true spirit and scope of the invention. All conventional art references described above are herein incorporated in their entirety by reference.

What is claimed is:

1. A semiconductor light-emitting device, comprising:
    a metallic cap including a light-emitting window, a first circular cylinder having a first inner diameter and a second circular cylinder having a second inner diameter, made from a metallic plate, and formed in a substantially circular cylindrical shape that overlaps the first circular cylinder on the second circular cylinder, the first inner diameter of the first circular cylinder being smaller than the second inner diameter of the second circular cylinder, the light-emitting window made of a transparent material, and being sealed using the metallic plate of the first circular cylinder;
    a metallic base having a top surface, a bottom surface, a side surface and through holes made from a metallic plate, and formed in a substantially planar shape, the top surface of metallic base including an outer circumference, and also mounting the metallic cap on the top surface of the metallic base so as to expose the outer circumference of the top surface from the metallic cap;
    terminal pins being hermetically sealed in a respective one of the through holes of the metallic base, respectively, and passing through the metallic base, and further extending in an opposite direction of the top surface of the metallic base;
    a semiconductor light source having electrodes, a light-emitting surface and an optical axis mounted on the top surface of the metallic base, being airproofed between the metallic cap and the metallic base, the light-emitting surface of the semiconductor light source facing the light-emitting window of the metallic cap, the optical axis of the semiconductor light source intersecting with the light-emitting window of the metallic cap at a substantially right angle, and thereby operating as an optical axis of the semiconductor light-emitting device, and each of the electrodes of the semiconductor light source being electrically connected to a respective one of the terminal pins;
    a heat sink plate having a top surface and a bottom surface, and the top surface of the heat sink contacting with the bottom surface of the metallic base;
    a holder having an inner bottom surface, an outer bottom surface, a first flange, a second flange, an inner side surface and a body including the inner bottom surface and the inner side surface, the holder attaching the metallic base on the top surface of the heat sink plate along with the metallic cap between the inner bottom surface of the body of the holder and the top surface of the heat sink plate, and therefore the inner bottom surface of the body of the holder contacting with at least the outer circumference of the top surface of the metallic base, the first flange of the holder extending in an opposite direction of the metallic base from the body along the heat sink plate in a cross-sectional view taken along the optical axis of the device, and the second flange of the holder extending toward the first circular cylinder of the holder from the body over the second circular cylinder in the cross-sectional view taken along the optical axis of the device;
    a thermal interface material (TIM) layer being disposed between the top surface of the heat sink plate and the outer bottom surface of the holder; and
    a thermal conductive elastic member disposed between the side surface of the metallic base and the inner side surface of the body of the holder.

2. The semiconductor light-emitting device according to claim 1, wherein the TIM layer is made from one of a thermal conductive grease and a thermal conductive sheet.

3. The semiconductor light-emitting device according to claim 1, wherein the TIM layer includes a thermal conductive silicone.

4. The semiconductor light-emitting device according to claim 1, further comprising:
    screws attaching the metallic base on the top surface of the heat sink plate along with the metallic cap between the inner bottom surface of the body of the holder and the top surface of the heat sink plate, and passing through the first flange of the holder and the TIM layer.

5. The semiconductor light-emitting device according to claim 1, wherein the light-emitting window of the metallic cap is made of at least one of a glass, a transparent resin and a lens.

6. The semiconductor light-emitting device according to claim 1, further comprising:
    a radiating fin located on the bottom surface of the heat sink plate, and extending from the bottom surface of the heat sink plate in an opposite direction of the top surface of the heat sink plate.

7. The semiconductor light-emitting device according to claim 1, wherein the thermal conductive elastic member is made from one of an acrylic rubber series and a thermoplastic elastomer series.

8. The semiconductor light-emitting device according to claim 1, wherein the metallic cap is made from an alloyed material based upon Iron (Fe).

9. The semiconductor light-emitting device according to claim 1, wherein the metallic base is made from an alloyed material based upon Iron (Fe).

10. The semiconductor light-emitting device according to claim 1, wherein the metallic cap and the metallic base are made from a substantially same material.

11. A semiconductor light-emitting device, comprising:
    a metallic cap including a light-emitting window made from a metallic plate, and formed in a substantially circular cylindrical shape, the light-emitting window made of a transparent material, and being sealed using the metallic plate of the metallic cap;
    a metallic base having a top surface, a bottom surface, a side surface and through holes made from a metallic plate, and formed in a substantially planar shape, the top surface of metallic base including an outer circumference, and also mounting the metallic cap on the top surface of the metallic base so as to expose the outer circumference of the top surface from the metallic cap;
    terminal pins being hermetically sealed in a respective one of the through holes of the metallic base, respectively, and passing through the metallic base, and further extending in an opposite direction of the top surface of the metallic base;

a semiconductor light source having electrodes, a light-emitting surface and an optical axis mounted on the top surface of the metallic base, being airproofed between the metallic cap and the metallic base, the light-emitting surface of the semiconductor light source facing the light-emitting window of the metallic cap, the optical axis of the semiconductor light source intersecting with the light-emitting window of the metallic cap at a substantially right angle, and thereby operating as an optical axis of the semiconductor light-emitting device, and each of the electrodes of the semiconductor light source being electrically connected to a respective one of the terminal pins;

a heat sink plate having a top surface and a bottom surface, and the top surface of the heat sink contacting with the bottom surface of the metallic base;

a holder having an inner bottom surface, an outer bottom surface, a flange, an inner side surface and a body including the inner bottom surface and the inner side surface, the holder attaching the metallic base on the top surface of the heat sink plate along with the metallic cap between the inner bottom surface of the body of the holder and the top surface of the heat sink plate, and therefore the inner bottom surface of the body of the holder contacting with at least the outer circumference of the top surface of the metallic base, and the flange of the holder extending in an opposite direction of the metallic base from the body along the heat sink plate in a cross-sectional view taken along the optical axis of the device;

a thermal interface material (TIM) layer being disposed between the top surface of the heat sink plate and the outer bottom surface of the holder; and a thermal conductive elastic member being disposed between the side surface of the metallic base and the inner side surface of the body of the holder.

12. The semiconductor light-emitting device according to claim 11, wherein the TIM layer is made from one of a thermal conductive grease and a thermal conductive sheet.

13. The semiconductor light-emitting device according to claim 11, wherein the TIM layer includes a thermal conductive silicone.

14. The semiconductor light-emitting device according to claim 11, further comprising:
screws attaching the metallic base on the top surface of the heat sink plate along with the metallic cap between the inner bottom surface of the body of the holder and the top surface of the heat sink plate, and passing through the first flange of the holder and the TIM layer.

15. The semiconductor light-emitting device according to claim 11, wherein the light-emitting window of the metallic cap is made of at least one of a glass, a transparent resin and a lens.

16. The semiconductor light-emitting device according to claim 11, further comprising:
a radiating fin located on the bottom surface of the heat sink plate, and extending from the bottom surface of the heat sink plate in an opposite direction of the top surface of the heat sink plate.

17. The semiconductor light-emitting device according to claim 11, wherein the thermal conductive elastic member is made from one of an acrylic rubber series and a thermoplastic elastomer series.

18. The semiconductor light-emitting device according to claim 11, wherein the metallic cap is made from an alloyed material based upon Iron (Fe).

19. The semiconductor light-emitting device according to claim 11, wherein the metallic base is made from an alloyed material based upon Iron (Fe).

20. The semiconductor light-emitting device according to claim 11, wherein the metallic cap and the metallic base are made from a substantially same material.

\* \* \* \* \*